(12) United States Patent
Reber et al.

(10) Patent No.: US 9,601,354 B2
(45) Date of Patent: Mar. 21, 2017

(54) SEMICONDUCTOR MANUFACTURING FOR FORMING BOND PADS AND SEAL RINGS

(71) Applicants: Douglas M. Reber, Austin, TX (US); Sergio A. Ajuria, Austin, TX (US); Phuc M. Nguyen, Austin, TX (US)

(72) Inventors: Douglas M. Reber, Austin, TX (US); Sergio A. Ajuria, Austin, TX (US); Phuc M. Nguyen, Austin, TX (US)

(73) Assignee: NXP USA, Inc., Austin, TX (US)

( * ) Notice: Subject to any disclaimer, the term of this patent is extended or adjusted under 35 U.S.C. 154(b) by 310 days.

(21) Appl. No.: 14/470,383

(22) Filed: Aug. 27, 2014

(65) Prior Publication Data
US 2016/0064294 A1    Mar. 3, 2016

(51) Int. Cl.
| | |
|---|---|
| *H01L 21/66* | (2006.01) |
| *H01L 21/48* | (2006.01) |
| *H01L 23/00* | (2006.01) |
| *H01L 23/522* | (2006.01) |
| *H01L 23/58* | (2006.01) |

(52) U.S. Cl.
CPC ........ *H01L 21/4846* (2013.01); *H01L 23/522* (2013.01); *H01L 23/585* (2013.01); *H01L 24/02* (2013.01); *H01L 24/92* (2013.01); *H01L 24/94* (2013.01); *H01L 22/34* (2013.01); *H01L 23/562* (2013.01); *H01L 24/03* (2013.01); *H01L 24/05* (2013.01); *H01L 24/11* (2013.01); *H01L 24/13* (2013.01); *H01L 24/81* (2013.01); *H01L 24/85* (2013.01); *H01L 2224/0237* (2013.01); *H01L 2224/0239* (2013.01); *H01L 2224/02311* (2013.01); *H01L 2224/02371* (2013.01); *H01L 2224/039* (2013.01); *H01L 2224/0392* (2013.01); *H01L 2224/0401* (2013.01); *H01L 2224/04042* (2013.01); *H01L 2224/05023* (2013.01); *H01L 2224/05548* (2013.01); *H01L 2224/05568* (2013.01); *H01L 2224/05572* (2013.01); *H01L 2224/05624* (2013.01); *H01L 2224/05647* (2013.01); *H01L 2224/1146* (2013.01); *H01L 2224/131* (2013.01); *H01L 2224/13147* (2013.01); *H01L 2224/81203* (2013.01); *H01L 2224/85048* (2013.01); *H01L 2224/8581* (2013.01); *H01L 2224/85205* (2013.01); *H01L 2224/85207* (2013.01); *H01L 2224/92* (2013.01); *H01L 2224/9212* (2013.01); *H01L 2224/94* (2013.01); *H01L 2924/00014* (2013.01)

(58) Field of Classification Search
None
See application file for complete search history.

(56) References Cited

U.S. PATENT DOCUMENTS

| | | |
|---|---|---|
| 2,622,574 A | 12/1952 | Butterworth |
| 4,622,574 A | 11/1986 | Garcia |
| 6,180,503 B1 * | 1/2001 | Tzeng ................ H01L 23/5258 257/529 |

(Continued)

*Primary Examiner* — Shaun Campbell

(57) ABSTRACT

An integrated circuit die includes a first bond pad having a bond contact area at a first depth into a plurality of build-up layers over a semiconductor substrate of the integrated circuit die, having sidewalls that surround the bond contact area, the sidewalls extending from the first depth to a top surface of the plurality of build-up layers, and having a top portion that extends over a portion of a top surface of the plurality of build-up layers.

12 Claims, 8 Drawing Sheets

(56) References Cited

U.S. PATENT DOCUMENTS

| | | |
|---|---|---|
| 6,518,643 B2 | 2/2003 | McDevitt et al. |
| 6,951,801 B2 | 10/2005 | Pozder et al. |
| 2003/0216009 A1* | 11/2003 | Matsuura ............ H01L 23/544 438/460 |
| 2008/0233740 A1* | 9/2008 | Reinert ................ H01L 21/486 438/667 |
| 2010/0072578 A1* | 3/2010 | Kunishima .......... H01L 23/585 257/620 |
| 2010/0314727 A1* | 12/2010 | Uchida ................ H01L 23/562 257/659 |
| 2014/0319522 A1* | 10/2014 | Daubenspeck ........ H01L 24/11 257/48 |

* cited by examiner

SEMICONDUCTOR MANUFACTURING FOR FORMING BOND PADS AND SEAL RINGS

TECHNICAL FIELD

This technical field relates to semiconductor processing and, more particularly, to forming bond pads and seal rings on semiconductor die.

BACKGROUND

Test circuitry is often included within a semiconductor device die so that self test procedures can be utilized after manufacture of the semiconductor device die. Having self test circuitry built into the semiconductor device die often improves test cycle time; however, this self test circuitry consumes a portion of the die area thereby increasing the size for the resulting semiconductor package for the die. Further, this self test circuit can also require externally accessible test connection pads that are electrically active, and these test pads can lead to misuse by customers. For example, a semiconductor die can include one or more pins on a package that are only used during test procedures. These test-only pins can lead to incorrect use or treatment by end customers that lead to device failures. Further, even when properly grounded by the end customer, such test-only pins still must meet full ESD (electro-static discharge) and latch-up requirements for external pins in order to achieve customer qualification. Thus, while it is efficient for test purposes to include test circuitry within the semiconductor die, this on-chip test circuitry can require increased die and package sizes and lead to problems from customer misuse.

A plurality of semiconductor device die are typically formed on a semiconductor substrate. A seal ring around each die provides a protective metal barrier for the internal device circuitry within the die, such as test circuitry. The seal ring is formed using metal layers and metal vias through dielectric layers that lie between the metal layers. The structures for the seal ring are formed during semiconductor processing steps used to form the device circuitry for the semiconductor device die. One or more cuts will be made through scribe lines to singulate the semiconductor device die once the semiconductor processing steps for the semiconductor substrate are completed.

When one or more cuts are made within the scribe lane to singulate the semiconductor die, the seal ring structures will be left at the edge of the die to form a protective metal barrier that extends from the surface of the die to the substrate. It is again noted that seal ring structures are typically used for protective purposes, such as to reduce edge cracks, to reduce ionic contamination, and/or to serve other protective purposes.

In addition to seal ring structures, bond pads are typically formed on the die that can be used to connect active circuitry in the die to external components. One type of connection is referred to as a wirebond. To form a wirebond, a wire is held in a bonding tool while a free air ball (FAB) is formed at the end of wire by electrical flame-off that heats the end of wire to a malleable state. The FAB is then lowered to contact the bond pad, compressed, and subjected to ultrasonic generation (USG). The vibration of the USG effectively scrubs the FAB against the aluminum bond pad, promoting interdiffusion of the metal of the FAB and the metal of the bond pad, creating a conductive intermetallic compound. It is often found that the forces generated during wirebonding in technologies also utilizing low-k inter-layer dielectrics (ILD) are susceptible to wire bond delamination or ILD cracking.

Pillar connections may also be employed as a means of attaching the die to a substrate or another die. Pillar connections are typically created through several deposition, plating, photolithography and etch steps. The pillars commonly include a copper post with a solder tip. Similar to wirebond connections, pillar connections can result in forces from thermocompression bonding or due to thermal coefficient of expansion mismatches which can result in excessive stress on the bond pad below the pillar. The excessive stress can cause pad delamination or ILD cracking.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Embodiments are disclosed for semiconductor manufacturing using disposable test circuitry formed within scribe lanes. The manufacturing steps can include forming device circuitry within a semiconductor die and forming test circuitry within a scribe lane. One or more trenches can be formed in each die and located inside an outer perimeter of the die. The trenches can be filled or lined with dielectric and/or conductive material to form a bond pad. Electrical connection route lines can be formed that connect the device circuitry to bond pads and test circuitry blocks. After testing, the test circuitry is discarded when the device die are singulated. For certain embodiments, the edge of the devices die are encapsulated with a protective metal layer, and certain other embodiments include protective seal rings through which the connection route lines pass to enter the die from the test circuitry blocks within the scribe lanes. This encapsulation of the edge of the die can be achieved with or without using seal ring structures. Different features and variations can also be implemented, as desired, and related or modified systems and methods can be utilized, as well.

Figure 1:
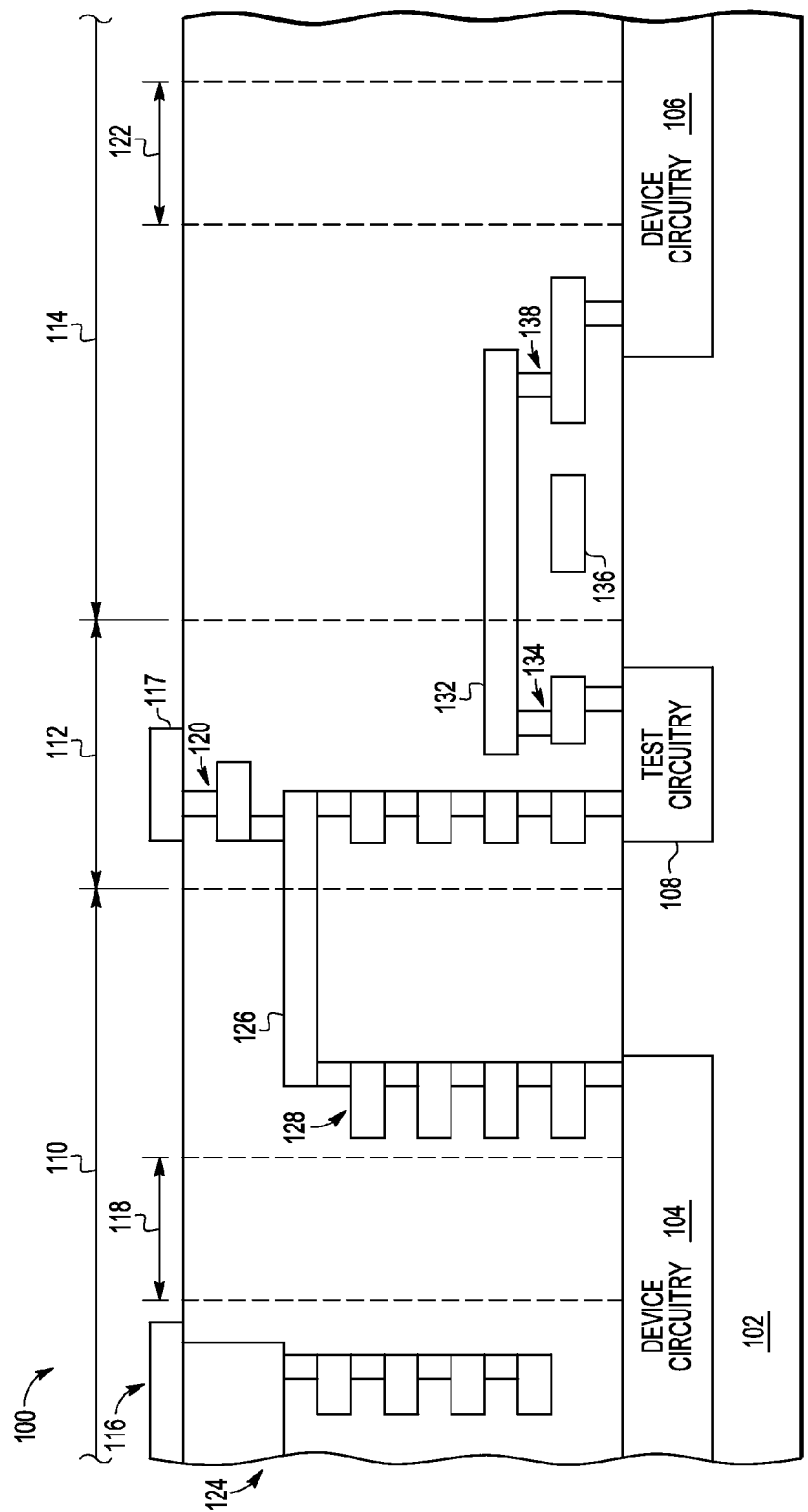
FIG. 1 illustrates a cross-section view of an embodiment of a semiconductor wafer with shared test circuitry within a scribe lane between two device die.

FIG. 1 illustrates a cross-section view of an embodiment of a semiconductor wafer 100 with shared test circuitry 108 within a scribe lane 112 between two device die 110, 114 and bond pad regions 118, 122 adjacent interconnect structures 124, 128, 138 where bond pads will be formed. Bond pad regions 118, 122 are positioned in an area of die 110, 114 where build-up layers (also referred to as interlayer dielectric) are formed that is typically devoid of interconnect structures. The build-up or interlayer dielectric layers extend from the top surface of substrate 102 to either flush with or just below the first metal layer of die 110, 114 where contact pad 116 is formed.

Scribe lane 112 represents a location where a cut will be made to singulate the device die 110, 114. At least one respective connection route line 126, 132 is made between the device circuitry 104, 106, respectively, formed in the device die 110, 114 and the test circuitry 108, respectively. As described further herein, the test circuitry 108 is used to test the device circuitry during manufacturing and is then discarded when the device die are singulated. As such, the test circuitry 108 is disposable. It is noted that the size of the scribe lane 112 can be adjusted depending upon the size and placement of the disposable test circuitry 108 shared between device die 110, 114. Various configurations could be also used for locating test circuitry within scribe lanes 112. Further, while only two die 110, 114 are shown in FIG. 1, additional semiconductor device die, test circuitry blocks, and related scribe lanes would be provided across the entire semiconductor substrate, such as a semiconductor wafer 100, being used for manufacturing the semiconductor device die 110, 114.

It is noted that the test circuitry 108 can include transistors, diodes, resistors, capacitors, and/or other desired circuit elements and/or combinations of circuits elements formed within the semiconductor substrate to provide circuitry configured to be used to test device circuitry formed within the device die 110, 114. It is further noted that the disposable test circuitry 108 formed within the scribe lane 112 can be any desired test circuitry, such as for example, self test circuitry, process optimization structures, test points, and/or another other desired test structures. Multiple connection route lines 126, 132 and interconnect structures 120, 128, 134, 138 are formed between each device die and the test circuitry 108.

Semiconductor substrate 102 can be any desired semiconductor material or combination of materials, such as gallium arsenide, silicon germanium, silicon, monocrystalline silicon, other semiconductor materials, and combinations of these semiconductor materials. Still further, the substrate 102 can be formed on top of other substrate materials including a separate non-semiconductor material, if desired, such as thin film semiconductor substrates formed on other semiconductor or non-semiconductor materials. Further variations could also be implemented, as desired.

Device circuitry 104, 106 is formed within the semiconductor substrate 102 and can include transistors, diodes, resistors, capacitors, and/or other desired circuit elements and/or combinations of circuits elements formed within the semiconductor substrate to provide circuitry configured to perform desired functionality for device die 110, 114. Interconnect structures 124, 128, 120, 134, 136, 138 are formed using a plurality of metal layers and vias between these metal layers. Further, as indicated above, one or more additional connection route lines and interconnect structures could also be utilized for the die 110, 114, if desired.

Contact pad 116 is formed on the top surface of interconnect structure 124 and can be used to provide external access to device circuitry 104. A probe pad site 117 is formed on the top surface of the interconnect structure 120 within the scribe lane 112, and this probe pad site 117 can be used to provide external access to the test circuitry 108. Interconnect structure 120 is formed between the probe site 117 and test circuitry 108. Route line 126 is coupled to interconnect structure 120. Interconnect structure 134 is formed between the test circuitry 108 and route line 132.

Connection route lines 126, 132 connect respective device circuitry 104, 106 to the shared test circuitry 108. Once the test circuitry 108 has been used to test the device circuitry 104, 106 and/or is used for other test purposes, the test circuitry 108 is no longer needed. As described herein, when one or more cuts are made within the scribe lane 112 to singulate the semiconductor die 110, 114, the self test circuitry 108 is discarded.

Figure 2:
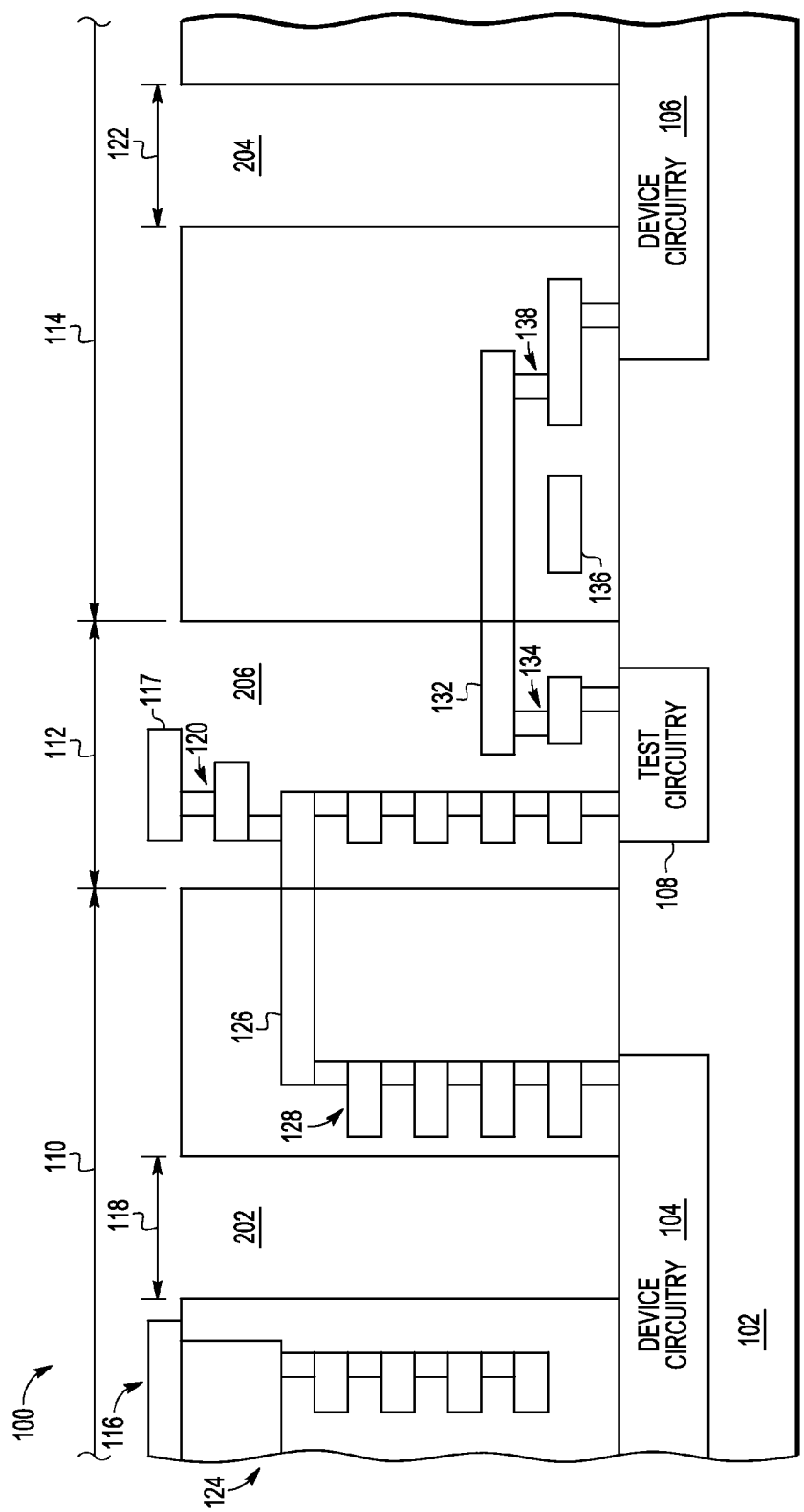
FIGS. 2-6 illustrate cross-section views of the semiconductor wafer of FIG. 1 after successive stages processing.

FIGS. 2-6 illustrate cross-section views of the semiconductor wafer of FIG. 1 after successive stages of processing. FIG. 2 is a cross-section view diagram of semiconductor wafer 100 after an etch processing step has been used to remove non-metal layers within bond pad regions 118, 122 and the scribe lane 112. Before etching, a photoresist layer is formed and patterned so contact pad 116 and interconnect structures 124, 126, 128, 132, 136, 138 in respective device die 110, 114 are covered and protected while the bond pad regions 118, 122 and scribe lane 112 are left uncovered and unprotected. The etch processing step is then used to etch the non-metal layers within bond pad regions 118, 122 and scribe lane 112, which are shown as already being removed with openings 202, 204, 206 remaining in FIG. 2.

It is noted that a back-end-of-line (BEOL) deep trench etch can be used to remove the non-metal layers, although other etch processing steps could also be utilized. It is further noted that the non-metal layers can include, for example, one or more dielectric layers, such as oxide or nitride layers, and the BEOL deep trench etch can be implemented using any desired techniques. An example BEOL technique is plasma etching or reactive ion etching using an etchant gas containing fluorocarbons, and anisotropic etching can be accomplished by plasma etching in a plasma containing chlorine and argon or hydrogen bromide. Another example technique is through-silicon-via etch chemistry based on a plasma generated from a reactive gas, which can be a fluorine-based gas or any other reactant gas capable of etching silicon oxide at a relatively fast etch rate. Because the metal layers are typically dispersed in an inter-layer dielectric (ILD) material, a combination of a fluorine-based gas and a rapid ILD plasma etchant such as chlorine, hydrogen bromide, or hydrogen as the etchant, could be used. While these are dry etch implementations, it is also possible to etch the bond pad regions 118, 122 and scribe lane 112 with a wet chemical etch or with a combination of wet and dry etch chemistries. After the etch processing step has completed, contact pad 116, probe site 117 and interconnect structures 120, 312, 134 remain within the scribe lane 112.

Figure 3:
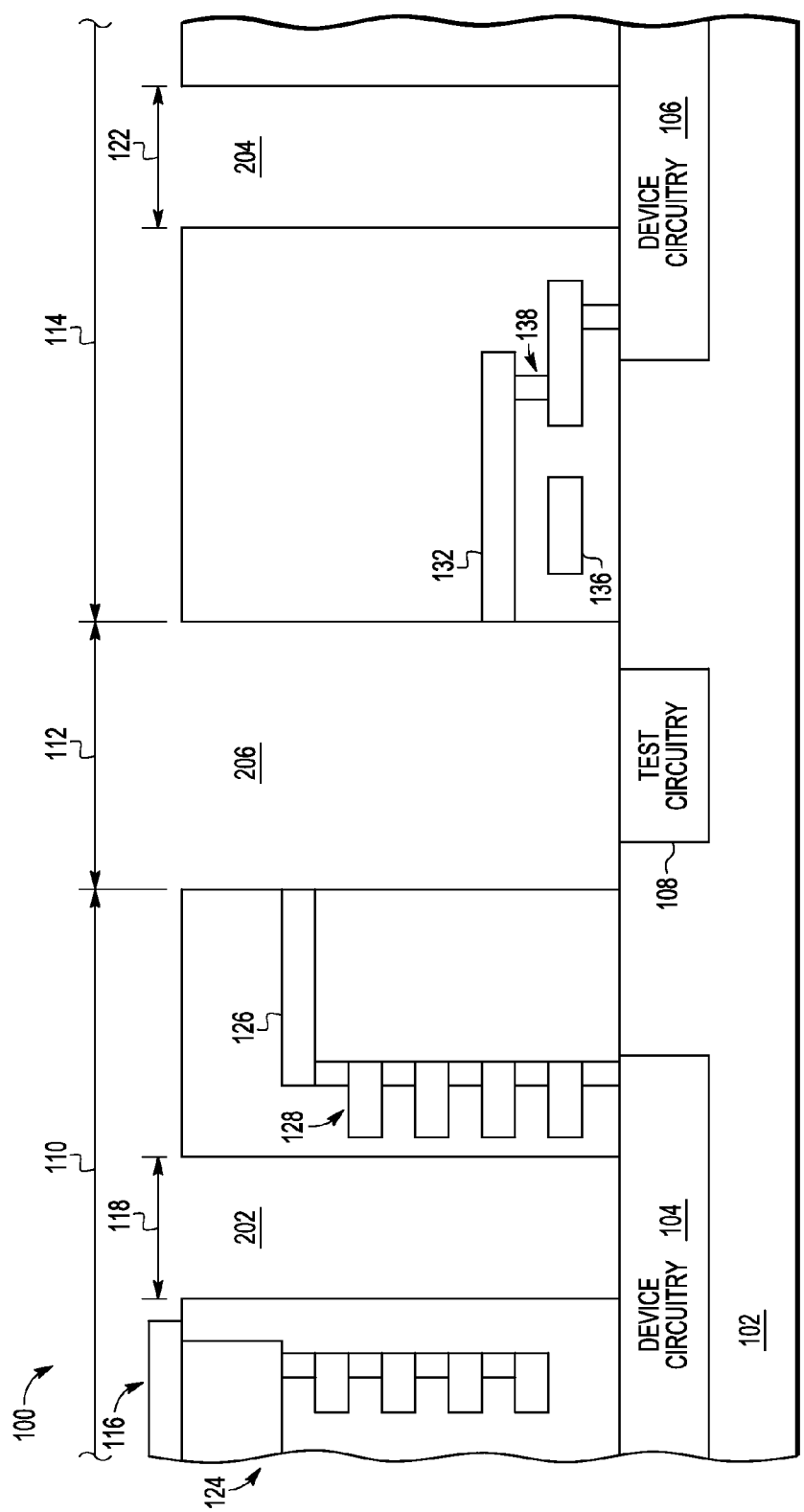

FIG. 3 is a cross-section view diagram of semiconductor wafer 100 after a metal etch processing step has been used to remove metal layers within the scribe lane 112. The photoresist layer can be left covering the contact pad 116 and interconnect structures 124, 126, 128, 132, 136, 138 in respective device die 110, 114. The metal etch processing step is then used to etch the metal layers and vias within the scribe lane 112 that were left after the non-metal etch processing step of FIG. 2. These metal layers and vias are shown as already being removed in FIG. 3. It is noted that a back-end-of-line (BEOL) deep trench metals etch can be used to remove the metal layers, although other etch processing steps could also be utilized. It is further noted that the metal layers can include, for example, one or more conductive metal layers, such as aluminum, copper, tantalum, tungsten, titanium, and/or other desired metal layers, and the BEOL deep trench metals etch can be implemented using any desired etching technique. For example, an isotropic dry etchant, such as chlorine, can be used. A wet chemical etchant, such as phosphoric acid, nitric acid, or acetic acid, can also be used. After the metal etch processing step has completed, only the substrate 102 and self test circuitry 108 are left within the scribe lane 112. It is further noted that a combination of dielectric and metal etch may be employed such that non-metal etch and metal etch occur simultaneously or in multiple non-metal etch/metal etch repeated cycles. Other variations could also be implemented.

Figure 4:
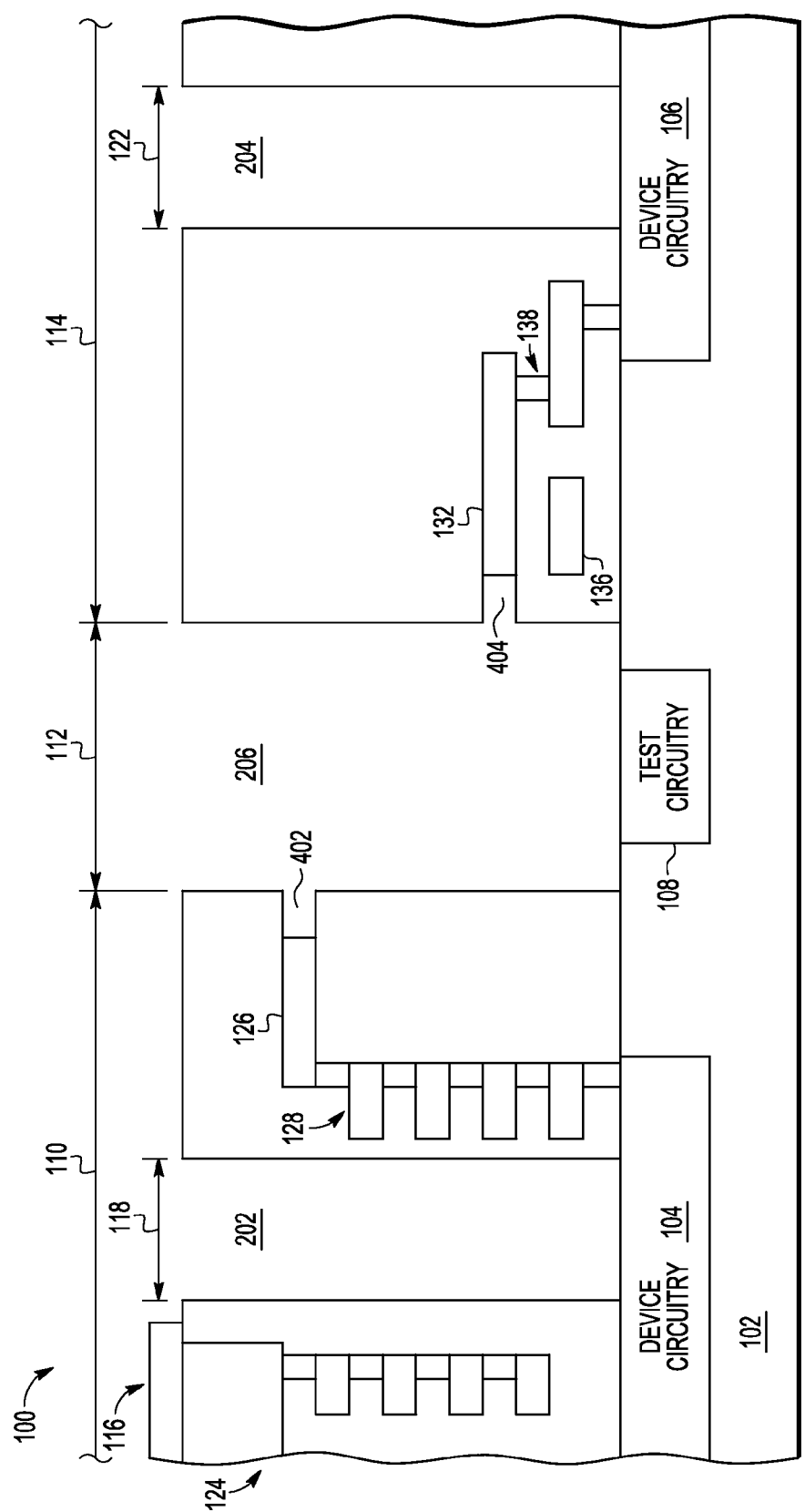

FIG. 4 is a cross-section view of wafer 100 after a metal recess etch processing step has been used to etch back the metal layers used for the connection route lines 126 and 132. The photoresist layer can be left covering contact pad 116 and interconnect structures 124, 126, 128, 132, 136, 138 in respective device die 110, 114. The metal recess etch processing step is then used to etch back route lines 126, 132 from the edge of the scribe lane 112 to form respective recesses 402, 404. It is noted that wet and/or dry recess etch processing steps can be used to etch back the metal layers. It is further noted that the recess etch can use an isotropic metal etchant that is selective to the metal used for the connection route lines 126, 132. For example, if copper is used for the metal layers that form the connection route lines 126, 132, then an isotropic etchant that is selective to copper can be used, such as a chlorine etchant for an isotropic dry etch or such as phosphoric acid, nitric acid, or acetic acid for a wet chemical etch. After the metal recess etch processing step has completed, recesses 402, 404 are left within the edges of the scribe lane 112. It is further noted that the metal etch in FIG. 3 and the metal recess etch in FIG. 4 could be combined and performed simultaneously or as part of multiple etch cycles. Other variations could also be implemented to form the recesses 402, 404.

Figure 5:
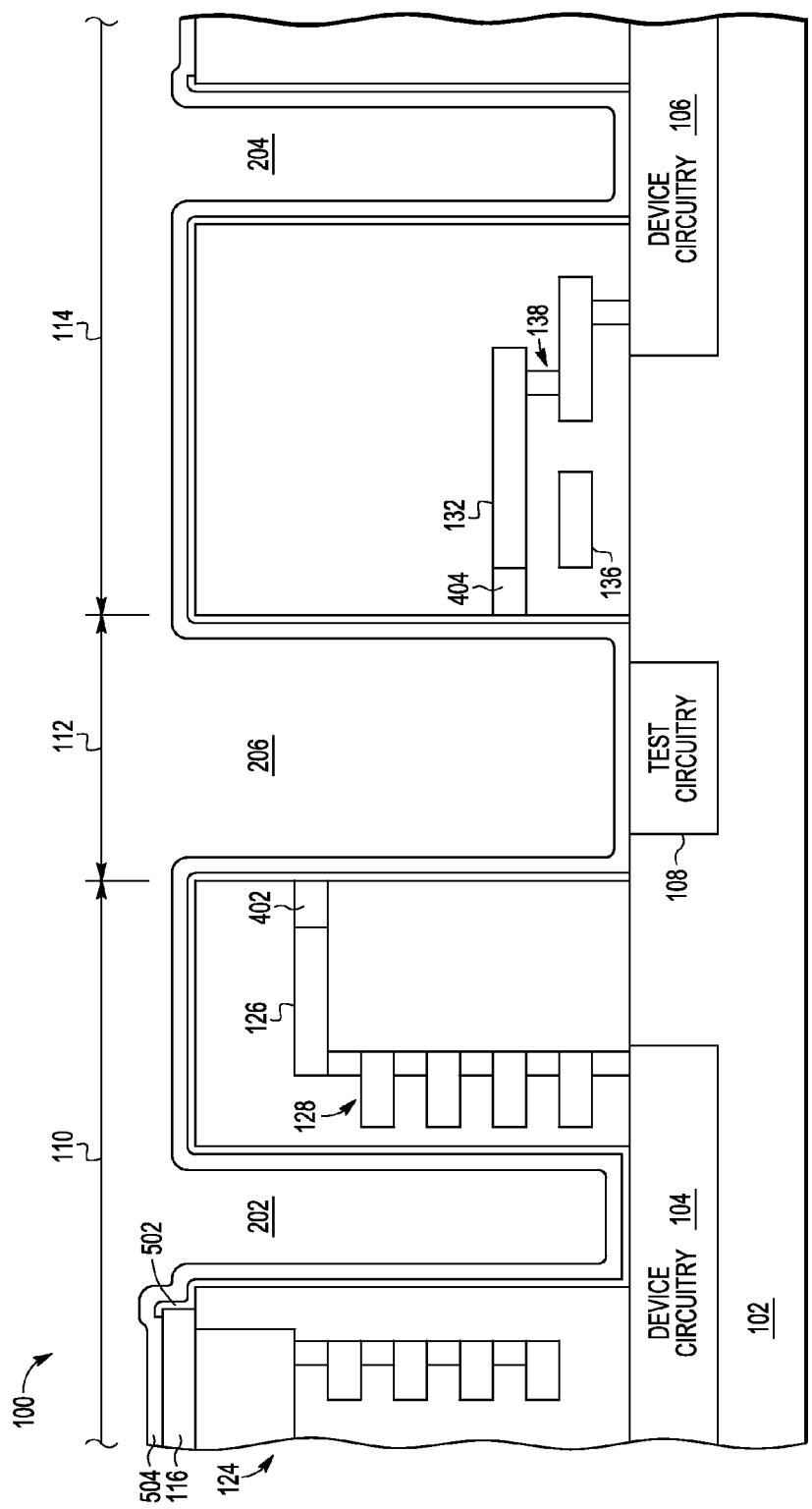

FIG. 5 is a cross-section view of semiconductor wafer 100 after isolation dielectric layer 502 and conductive layer 504 are formed. Dielectric layer 502 is formed along the exposed surfaces the device die 110, 114 and within the scribe lane 112. The isolation dielectric layer 502 keeps the connection route lines 126, 132 from electrically connecting to a conductive layer 504. As such, the metal etch processing step to form recesses 402, 404 of FIG. 4 is not needed, although it could still be utilized if desired. It is noted that the isolation dielectric layer 502 can be an oxide, nitride, or another desired dielectric material. It is also noted that the isolation dielectric layer 502 can be deposited and/or grown depending upon the dielectric material chosen. For example, if a nitride layer is used, the nitride layer can be formed by plasma deposition from silane and ammonia. It is further noted one or more portions of the dielectric layer 502 above the substrate and below conductive layer 504 can be removed with an etch processing step prior to formation of conductive layer 504, such as shown over a portion of contact pad 116 and at the bottom of openings 204, 206. As such, conductive layer 504 touches the substrate 102 at the bottom of openings 204, 206 as shown in FIG. 5. Such a configuration can be used to couple ground or a voltage supply to a doped region of substrate 102, for example. Alternatively, the dielectric layer 502 can be left over the substrate 102 as shown at the bottom of opening 202 so that this portion of the dielectric layer 502 is positioned between the conductive layer 504 and the substrate 102. Other variations could also be implemented.

The conductive layer 504 can be, for example, an aluminum layer, a copper layer, or another desired metal layer. The conductive layer 504 provides bond pads at the bottom of openings 202 and 204 and effectively seals the edges of the die 110, 114 where connection route lines 126, 132 pass into the die 110, 114. If dielectric layer 502 is not used, recesses 402, 404 keep the conductive layer 504 from electrically connecting to the remaining connection route lines 126, 132. Further, the conductive layer 504 can be formed around the entire edge of the device die 110, 114 to provide an effective metal barrier for the device die 110, 114. It is noted that the conductive layer 504 can be formed, for example, by depositing aluminum, copper, or another desired metal through a conformal vapor deposition process. Other processing steps or a combination of conductive layers could also be used to form conductive layer 504, if desired.

Figure 6:
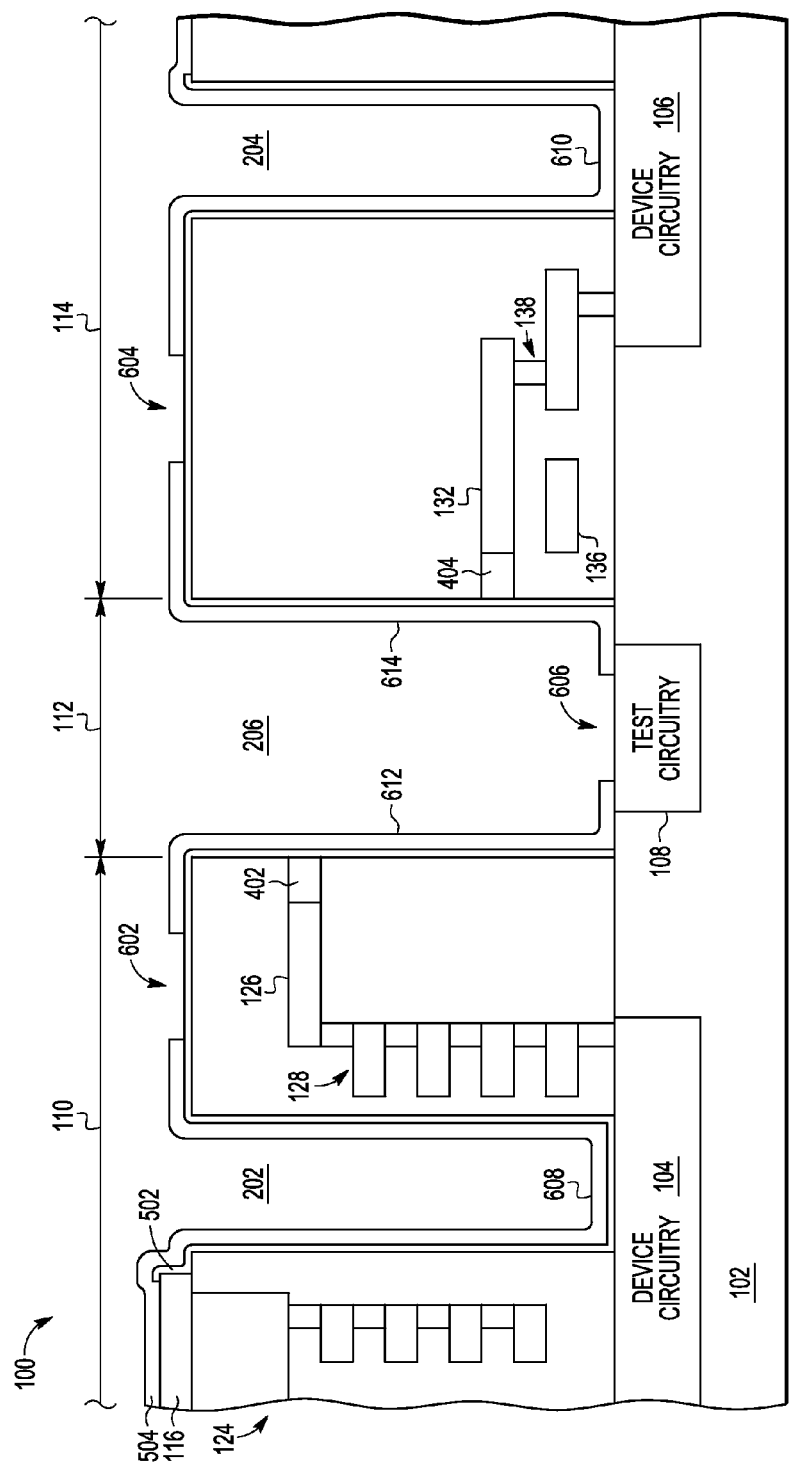

FIG. 6 is a cross-section view of semiconductor wafer 100 after portions of conductive layer 504 is removed to form openings 602, 604, 606 in conductive layer 504 over route lines 126, 132 and interconnect structures 128, 136, 138, and in scribe lane 112. Openings 602 and 604 isolate bond pads 608, 610 from portions 612, 614 of conductive layer 504 that seal the edges of die 110, 114. Conductive layer portions 612, 614 effectively serve as seal rings that aid in protecting die 110, 114, such as in preventing dielectric cracking and/or ionic contamination. It is noted that patterning and metal etching steps can be used to form openings 602, 604 and 606.

Figure 7:
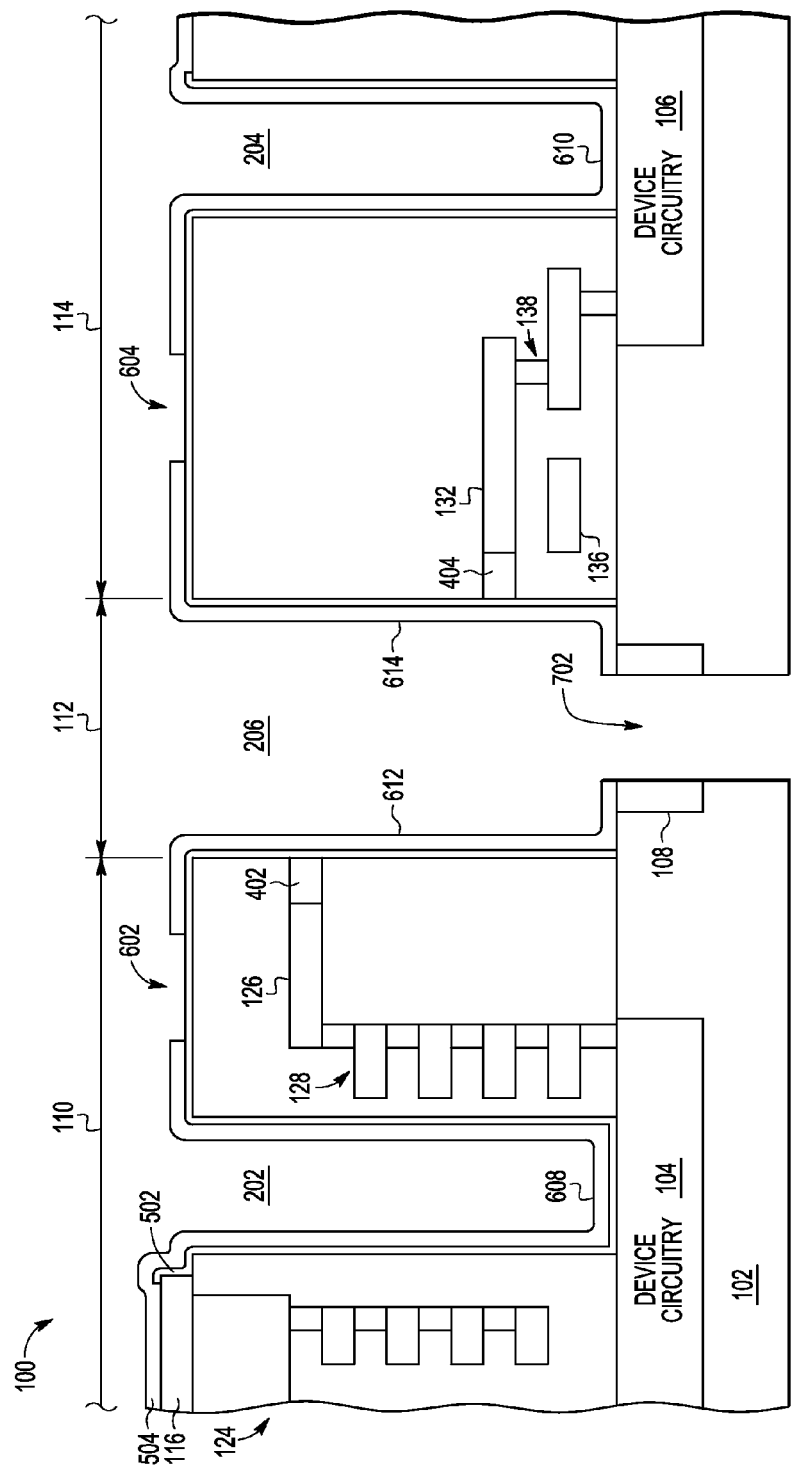
FIG. 7 illustrates a cross-section views of the die of the semiconductor wafer of FIG. 6 after singulation.

FIG. 7 is a cross-section view of semiconductor wafer 100 after a cut has been made within the scribe lane 112 to singulate device die 110,114. As described herein, the test circuitry 108 is no longer needed and is discarded when die are singulated during manufacture. It is noted that the particular location for the scribe lane cuts can be selected, as desired, and a die saw can be used to make the one or more scribe lane cuts within scribe lane 112, as well as other cuts used to singulate the die. It is noted that conductive layer portions 612, 614 are left along the edges of device die 110, 114 with respect to the scribe lane 112. As described above, conductive layer portions 612, 614 effectively seal the edges of the device die 110, 114 where the connection route lines 126, 132 passed to make the connection between the device circuitry 104, 106 and the test circuitry 108. It is noted that the conductive layer portions 612, 614 in sealing the edges of the device die 110, 114 effectively serving the purpose of seal ring structures to protect the die 110, 114, such as in preventing dielectric cracking and/or ionic contamination.

Figure 8:
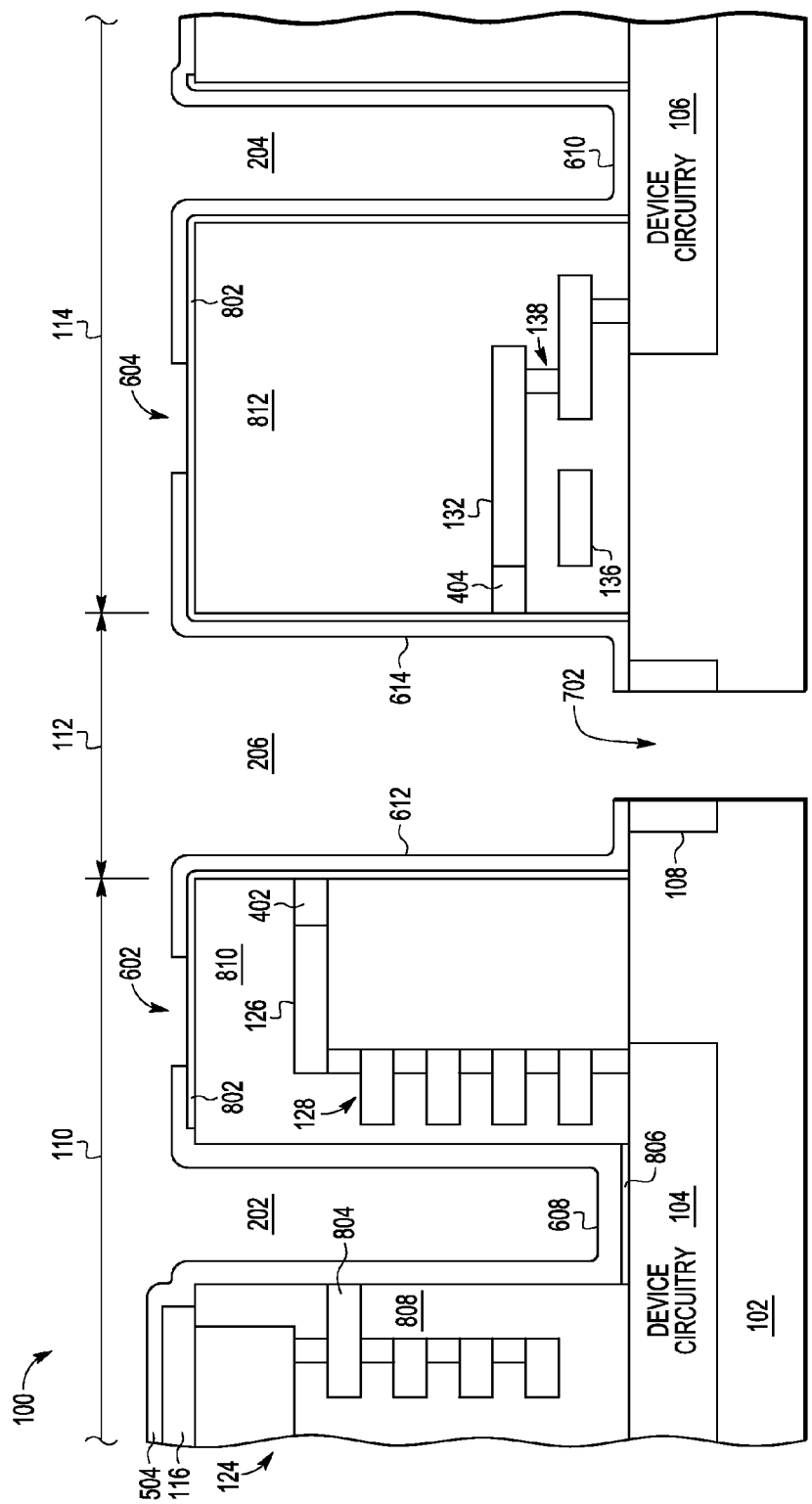
FIG. 8 illustrates a cross-section view of an alternate embodiment of the die of the semiconductor wafer of FIG. 6 after singulation.

FIG. 8 is a cross-section view of another embodiment of semiconductor wafer 100 in which dielectric layer 802 similar to dielectric layer 502 of FIG. 5 has been deposited and/or formed along sidewalls of die 110, 114 adjacent scribe lane 112, over a portion of build-up layer or interlayer dielectric section 810 of die 110 adjacent scribe lane 112, over the top of build-up layer or interlayer dielectric section 812 of die 114, and along sidewalls of bond pad opening 204 of die 114. Note that a transition layer 806 can comprise one or more of an etch stop layer, a second metal layer, and an isolation dielectric layer has been formed or deposited at the bottom of opening 202 under bond pad 608. Transition layer 806 is under at least a portion of bond pad 608. Note that no dielectric layer or other material has been formed or deposited where connection route line 804 is extended from interconnect structure 124 through the interlayer dielectric 808 to contact bond pad 608. Extended route line 804 forms a connection between bond pad 608 and the rest of interconnect structure 124. Interconnect structure 124 may be connected to portions of device circuitry 104 not shown in FIG. 8 or other suitable components. Other variations could also be implemented, as desired.

As described herein, a variety of embodiments can be implemented and different features and variations can be implemented, as desired.

By now it should be appreciated that in some embodiments, a method for making integrated circuits using a semiconductor substrate (102) can comprise etching (FIG. 2) a first pad opening (202 or 204) to a first depth into a plurality of build-up layers that are over the semiconductor substrate (102), depositing (FIG. 5) a conductive layer (504) over the plurality of build-up layers, including over the first pad opening and along sidewalls of the first pad opening, and etching (FIG. 6) the conductive layer to leave a remaining portion of the conductive layer over the first pad opening, along the sidewalls of the first pad opening, and extending over a portion of a top surface of the plurality of build-up layers to form a first bond pad (608 or 610) within the first pad opening.

In another aspect, the first depth is located at a top surface of the semiconductor substrate.

In another aspect, the method can further comprise depositing (FIG. 5) an isolation dielectric layer (502) over the semiconductor substrate, including over the first pad opening and along the sidewalls of the first pad opening (202 and 204).

In another aspect, the method can further comprise patterning (FIG. 5) the isolation dielectric layer to remove the isolation dielectric layer from over a first die contact pad (116) on top of the plurality of build-up layers. The first die contact pad (116) is located in an area adjacent to the first pad opening.

In another aspect, the method can further comprise patterning (FIG. 5) the isolation dielectric layer to remove the isolation dielectric layer from over the top surface of the semiconductor substrate.

6. In another aspect, the first depth can be located at a transition layer (806 in FIG. 8) of the plurality of build-up layers.

In another aspect, the transition layer comprises at least one of an etch stop layer, a second conductive layer, and an isolation dielectric layer.

In another aspect, the metal layer (504) can be conformal deposited (FIG. 5) over the top surface of the semiconductor substrate.

In another aspect, the conductive layer (504) can be conformal deposited (FIG. 5) over the isolation dielectric layer (502) and the first die contact pad (116).

In another aspect, the conductive layer (504) is conformal deposited over the transition layer (806 in FIG. 8).

In another aspect, the transition layer (806) comprises an isolation dielectric layer, an interconnect structure (804 in FIG. 8) can be exposed in a first sidewall of the first pad opening, and the conductive layer (504) can be conformal deposited over the first pad opening (202), including over the isolation dielectric layer within the first pad opening and along the sidewalls of the first pad opening, to form a connection with the interconnect structure (804).

In another aspect, the semiconductor substrate can comprise a first die (110), and the first bond pad can be located within a seal ring perimeter (edge at 110/112 transition) of the first die.

In another aspect, the etching the conductive layer further leaves a seal ring barrier (612 in FIG. 6) around the seal ring perimeter of the first die.

In other embodiments, an integrated circuit die can comprise a first bond pad (608) having a bond contact area at a first depth into a plurality of build-up layers over a semiconductor substrate (102) of the integrated circuit die, sidewalls that surround the bond contact area, the sidewalls extending from the first depth to a top surface of the plurality of build-up layers, and a top portion that extends over a portion of a top surface of the plurality of build-up layers.

In another aspect, the first depth can be located at a top surface of the semiconductor substrate (102).

In another aspect, the first depth can be located at a transition layer (806 in FIG. 8) of the plurality of build-up layers.

In another aspect, the transition layer can comprise at least one of an etch stop layer, a metal layer, and an isolation dielectric layer.

In another aspect, the transition layer can comprise an isolation dielectric layer, and a sidewall of the first bond pad forms a connection with a metal interconnect layer (804 in FIG. 8) of the plurality of build-up layers.

In another aspect, the top portion of the first bond pad can further extend over a first die contact pad (116) on top of the plurality of build-up layers.

In another aspect, the integrated circuit die can further comprise a seal ring barrier (612) surrounding the integrated circuit die the first bond pad located within the seal ring barrier.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:
1. A method for making integrated circuits using a semiconductor substrate, the method comprising:
 etching a first pad opening to a first depth into a plurality of build-up layers including interlayer dielectric layers and metal layers that are over the semiconductor substrate;
 depositing a conductive layer over the plurality of build-up layers, including over the first pad opening and along sidewalls of the first pad opening; and
 etching the conductive layer to leave a remaining portion of the conductive layer over the first pad opening, along the sidewalls of the first pad opening, and extending over a portion of a top surface of the plurality of build-up layers to form a first bond pad within the first pad opening;
 wherein the first depth is located at a transition layer of the plurality of build-up layers and the transition layer comprises an isolation dielectric layer, an interconnect structure is exposed in a first sidewall of the first pad opening, and the conductive layer is conformal deposited over the first pad opening, including over the isolation dielectric layer within the first pad opening and along the sidewalls of the first pad opening, to form a connection with the interconnect structure.

2. The method of claim 1, further comprising:

before depositing the conductive layer, depositing an isolation dielectric layer over the semiconductor substrate, including over the first pad opening and along the sidewalls of the first pad opening.

3. The method of claim 2, further comprising:

before depositing the conductive layer, patterning the isolation dielectric layer to remove the isolation dielectric layer from over a first die contact pad on top of the plurality of build-up layers, wherein the first die contact pad is located in an area adjacent to the first pad opening.

4. The method of claim 2, further comprising:

patterning the isolation dielectric layer to remove the isolation dielectric layer from over the top surface of the semiconductor substrate.

5. The method of claim 1, wherein the transition layer further comprises at least one of an etch stop layer, and a second conductive layer.

6. The method of claim 1, wherein the conductive layer is conformal deposited over the top surface of the semiconductor substrate.

7. The method of claim 1, wherein the semiconductor substrate comprises a first die, and the first bond pad is located within a seal ring perimeter of the first die.

8. The method of claim 7, wherein the etching the conductive layer further leaves a seal ring barrier around the seal ring perimeter of the first die.

9. An integrated circuit die comprising:

a first bond pad having a bond contact area at a first depth into a plurality of build-up layers over a semiconductor substrate of the integrated circuit die, an opening with sidewalls that surround the bond contact area, the sidewalls extending from the first depth to a top surface of the plurality of build-up layers, and a top portion that extends over a portion of a top surface of the plurality of build-up layers, wherein the first depth is located at a transition layer of the plurality of build-up layers and the transition layer comprises an isolation dielectric layer, an interconnect structure is exposed in a first sidewall of an opening in the plurality of build-up layers, and the first bond pad is conformal deposited over the opening in the plurality of build-up layers, including over the isolation dielectric layer within the opening in the plurality of build-up layers and along the sidewalls of the opening in the plurality of build-up layers, to form a connection with the interconnect structure.

10. The integrated circuit of claim 9, wherein the transition layer comprises at least one of an etch stop layer, and a metal layer.

11. The integrated circuit die of claim 9, wherein the top portion of the first bond pad further extends over a first die contact pad on top of the plurality of build-up layers.

12. The integrated circuit die of claim 9, further comprising a seal ring barrier surrounding the integrated circuit die, wherein the first bond pad is located within the seal ring barrier.

* * * * *